US006821202B2

(12) United States Patent
Voorhies

(10) Patent No.: US 6,821,202 B2
(45) Date of Patent: Nov. 23, 2004

(54) AIR MANAGING SYSTEM

(76) Inventor: Robert Voorhies, 4176 Baird Rd., Stow, OH (US) 44224

( * ) Notice: Subject to any disclaimer, the term of this patent is extended or adjusted under 35 U.S.C. 154(b) by 137 days.

(21) Appl. No.: 10/319,177

(22) Filed: Dec. 13, 2002

(65) Prior Publication Data
US 2003/0114099 A1 Jun. 19, 2003

Related U.S. Application Data
(60) Provisional application No. 60/341,438, filed on Dec. 13, 2001.

(51) Int. Cl.$^7$ .............................................. H05K 5/00
(52) U.S. Cl. ...................................... 454/184; 361/695
(58) Field of Search ......................... 454/184; 361/694, 361/695, 696; 165/122, 80.2, 104.33; 312/236

(56) References Cited

U.S. PATENT DOCUMENTS

| 1,479,630 | A | * | 1/1924 | Sperry ........................ 352/146 |
| 2,651,967 | A | * | 9/1953 | Thomas ....................... 352/104 |
| 4,120,575 | A | * | 10/1978 | Bach ............................ 353/39 |
| 6,109,767 | A | * | 8/2000 | Rodriguez ................... 362/294 |
| 6,561,655 | B2 | * | 5/2003 | Onichi et al. ................. 353/61 |

* cited by examiner

Primary Examiner—Derek Boles
(74) Attorney, Agent, or Firm—Murphey & Murphey, A.P.C.

(57) ABSTRACT

An air-managing system for a heat-generating, image-producing broadcast device mounted in a smoke laden or dust-laden environment, including a container including enclosed walls and an image broadcast aperture, to form an interior for containing the heat-generating, image-producing, broadcast device and further including inlet slots formed in the container walls, for receiving air into the container interior, a container exhaust opening, and a fan in communication with the exhaust opening for drawing air through the interior and pushing it out the container, a sealed enclosure comprising a top panel, bottom panel, opposed side panels and spaced-apart front and back panels in sealed engagement forming an interior therein large enough to house the container therein leaving space between the container walls and the enclosure panels, means in the sealed enclosure to align the image broadcast aperture with an image projection opening in one of the sealed enclosure panels, air-transfer means in communication with the sealed enclosure for pumping air, outside of the enclosure, into the sealed enclosure and developing a positive air pressure therein, and an air exhaust port formed in the sealed enclosure and connected to the fan in communication with the exhaust opening of the container to confine the flow of pressurized air in the enclosure means to a path passing through the broadcast device.

22 Claims, 3 Drawing Sheets

AIR MANAGING SYSTEM

This application claims the benefit of U.S. Provisional Application No. 60/341,438 filed Dec. 13, 2001.

BACKGROUND OF THE INVENTION

1. Field of the Invention

This invention relates to the field of air-managing systems. More particularly, this invention relates to providing a multi-media LCD (Liquid Crystal Display) image projector with clean, cool air to aid in the durability of its components.

2. Description of the Prior Art

The transferring of images onto big image-receiving screens by projectors has become very popular and important in our high technologically-oriented society of recent times. Such processes are used for a variety of purposes such as teaching in school class rooms, meetings in business conference rooms, and for entertaining in restaurants, bars, and other social gatherings. The emergence of the superior color-saturation and projection of the LCD image projectors onto large screens has expanded the popularity and variety of uses even more and the many advances in the LCD technology has inspired a fast-growing, diverse market in these devices. These optical images are projected onto giant screens to be viewed by a large number of people without compromising the quality of the images.

The LCD image projector, as well as other projectors, include highly sensitive electronic components such as crystals, resistors, switches, capacitors, etc. Other sensitive components include light bulbs, lenses, mirrors, the LCD screens, the internal wiring and connections therefor. These components are particularly sensitive to heat, chemicals and dirt that may be found in the air.

In restaurants, bars and other gathering places, movement of people around the room has caused owners of the equipment to mount the LCD projector high above the floor to keep people from walking or moving in front of the projector and interrupting the images on the screen. Unfortunately, crowds of people produce heat, cigarette and cigar smoke, fumes, grease, etc. Shuffling of feet, movement of tables and chairs cause the air to become contaminated with particles of dirt, dust, smoke and grease that rise to the ceiling and enter the housing of the LCD projector. These contaminants coat the electronic or other sensitive equipment and shorten the life of the individual components.

Further, LCD image projectors generate a lot of heat during operation. Heat is the nemesis of properly-functioning electronic equipment. To counter this, image projectors and related equipment are often manufactured with slots in outer housings, built-in internal fans, and exhaust ports that serve as a cooling feature. The projector fan, however, compounds the problem of dirty air around the image projector as it draws the ambient, dirty air from the outside environment into the projector and pulls pollutants into the components at an even a faster rate. Thus, its longevity is shortened.

In prior art enclosures to protect the image projector against accumulation of dirty air around the projector, the enclosure further increases the heat accumulation around the projector compounding the problem. This causes the components, specifically the light bulb, to become even hotter and further reduces its longevity.

LCD image projectors are expensive in that they may cost thousands of dollars. Repair of the components is costly as well, and may also take a long period of time to complete. Restaurants, bars and similar establishments generally cannot afford to be without their projectors as a great deal of the patronage attraction is the image-generated, large screen, entertainment.

Various prior art methods and apparatuses have been introduced to solve the pollutant problem that include protective container devices that surround the image projectors. These container devices are usually ineffective because they are not completely sealed around the projector and continue to allow access of the pollutant-containing air to the device and its sensitive components. They are bulky and do not tightly enclose the heat-generated projector and may also create a fire-hazard. The bulkiness is unattractive, and may further interfere with people's movement around the projector. When these projectors are placed in or near ceilings, they are out of the way of people's movements but are difficult to access and reside in a high-temperature area that raises the internal temperature of the projectors even more.

SUMMARY OF THE INVENTION

This invention is an air managing system for receiving a heat-generating broadcast device of the kind that includes a container having air-inlet ports formed therein, an air moving device for swirling the air coming into the container about the heat-generating broadcast device, and an air exhaust opening, in communication with the air moving device, to discharge the swirled air from the container. The invention comprises a sealed enclosure for receipt therein of the heat-generating broadcast device and its container, wherein the enclosure is defined by at least one air-receiving port and one air-exhaust port. An air-transfer means is provided, in communication with the sealed enclosure, for pumping air from outside of the enclosure into the enclosure and developing a positive air pressure inside the enclosure and inside the heat-generating broadcast device. An air exhaust port in provided in the enclosure and a connection is made between the sealed enclosure air exhaust port to and the heat-generating broadcast device container exhaust opening to confine the flow of pressurized air in the enclosure to an enclosed path passing into the sealed enclosure, through the container and the broadcast device located inside of it, and out the sealed enclosure exhaust port.

The invention therefore transfers air from outside the enclosure into the enclosure and around the container in which the heat-generating broadcast device is located to cool the container and the heat-generating broadcast device. In the preferred embodiment, the air flow is set in the air-transfer means to be more than the normal air flow drawn into the heat-generating broadcast device container by its internal fan. This air flow not only cools the heat-generating broadcast device but also cools the inside and outside of the container in which the broadcast device is carried. This air is then directed into the fan incorporated in the broadcast device through the slots or holes in the container. The air exhausts from the sealed enclosure through a duct or conveyance means, that is in communication with the exhaust opening and the cooling fan of the container. By this means, all air is used to cool the broadcast device, both on the outside as well as on the inside of the container and about the surfaces of the broadcast device's internal components. The air is conveyed from the enclosure limited to the path between the container internal fan and its outlet. This requires all cooling air to be passed through the container and over the broadcast device's internal components. A larger amount of cooling air is thus created as well as a path confined through the container. The passage of the larger amount of cooling air, in a path confined through the container, allows a positive air pressure to be developed between the outside and the inside of the enclosure to prevent dirt and smoke from entering the enclosure and the container. This keeps the heat-generating device free from contaminants and, in turn, keeps the image projector free from dust and dirt that would normally dim the images projected to the screen.

The main object of this invention is a device for extending the useful life of a heat-generating broadcast device of the kind that includes a container having air-inlet ports formed therein, an air moving device for swirling the air coming into the container about the heat-generating broadcast device, and an exhaust port, in communication with the air moving device, to discharge the swirled air outside the container. The invention is particularly useful in areas where the heat-generating broadcast device is mounted high off the floor or at ceiling level. Other objects of the invention include a means for lowering the maintenance operations and fees for such a device by reducing the number of times it has to be cleaned, and the instances when parts must be replaced due to heat-related failures of the components; and, a means for allowing a continuous showing of images on a screen without the concomitant tasks of cleaning and rejuvenating the internal workings of the equipment.

These and other objects of the invention will become more clear when one reads the following specification, taken together with the drawings that are attached hereto. The scope of protection sought by the inventor may be gleaned from a fair reading of the claims that conclude this specification.

DESCRIPTION OF THE PREFERRED EMBODIMENT

Figure 1:
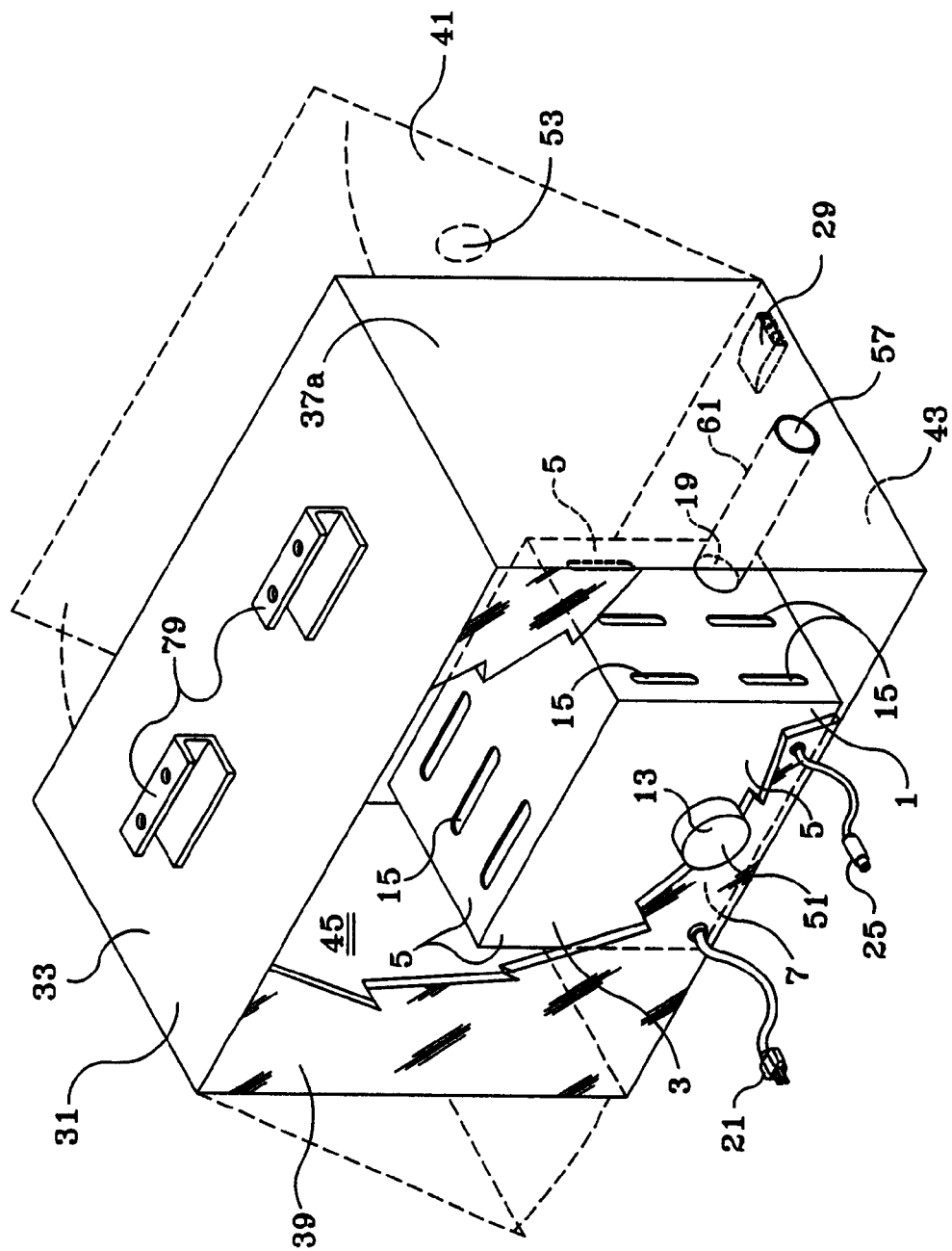
FIG. 1 is an illustrative view of the preferred embodiment of the invention with some areas of the sealed enclosure broken away to show the container in the interior thereof.
Figure 2:
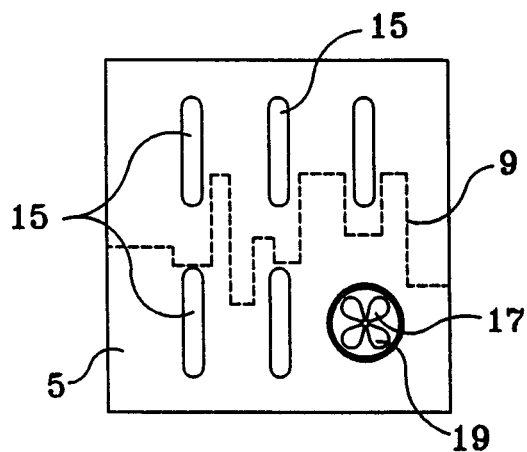
FIG. 2 is an end view of the container shown inside the sealed enclosure of FIG. 1.

Turning now to the drawings where elements are identified with numbers and like elements are identified with like numbers throughout the seven figures, FIGS. 1 and 2 show an air-cooled, multi-media image projector 1 to which this invention is applicable. Projector 1 includes an outer container 3, generally made of sheet metal, comprising a plurality of intersecting walls 5 forming an enclosed interior 7 that contains a heat-generating electronic image-projection device 9 (shown in dotted outline in FIG. 2) that may include an LCD image projector, movie projector, television receiver/projector, and the like. These devices are characterized by having an image projection opening or aperture 13 that may include a lens system for focusing the electronically produced images on a remotely located screen (not shown) that is positioned in a bar, restaurant, or other place of social gathering.

Container 3 is further characterized by having a series of apertures or slots 15 formed in the container walls, that allow the influx of air from outside container 3 to enclosed container interior 7, and an air circulating means, usually in the form of an electrically-driven fan 17, attached to an exhaust opening 19 for drawing air into container interior 7, through slots 15, swirling it over electrical image-producing device 9, such as transistors, capacitors, computer chips, and the like, located in the interior 7 of container 3, to pick up heat generated by the operation of device 9, and exhausting the heated air out of container 3 through an exhaust opening 19.

Figure 3:
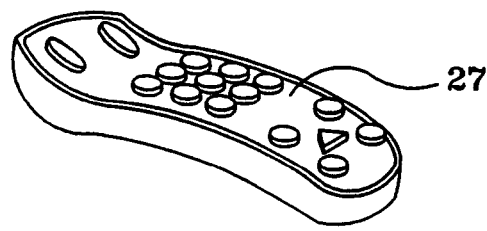
FIG. 3 is a perspective view of a typical hand-held remote useful in this invention.

As shown in FIG. 1, device 9 also includes a power cord 21, for plugging into an electrical outlet to provide electrical power to device 9, as well as a TV cable 25, or other antenna, and providing the necessary input to device 9 that ultimately results in the visual images that are projected through lens 13 onto the remotely located screen. As in all containers for electrical equipment, various wall panels making up the top, sides and bottom of container 3 may be made of metal, and are recoverable or latched, and hinged to swing out from their container position, in order to allow access to interior 7 thereof. The swing-out nature of these wall panels is not shown for brevity. In addition, a hand-held remote control 27 is shown in FIG. 3 that may be used to communicate with a remote sensor 29 (see FIG. 1), mounted adjacent container 3, for activating broadcast device 9 on demand so that the operator need not stand on a ladder to turn device 9 on and off.

Figure 6:
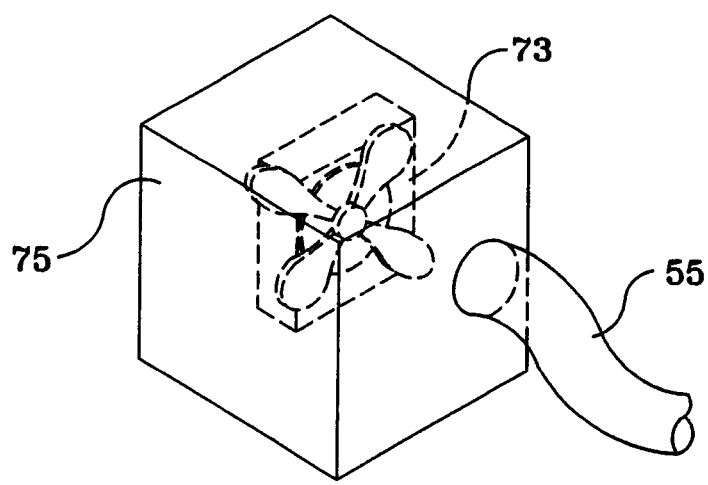
FIG. 6 is a partial view of a frame that may be used to form the sealed enclosure shown in FIG. 1; and, FIG. 7 is an illustrative view of a typical air-moving fan useful in this invention.

As shown in the figures, the air-management device of this invention comprises a sealed enclosure 31, including a top panel 33, opposed, spaced-apart side panels 37a and 37b (only side panel 37a is shown), a front panel 39, a rear or back panel 41, spaced apart from front panel 39, and a bottom panel 43. All said panels are connected together at their respective lines of intersection to form a fully enclosed box or enclosure having an interior 45. Sealed enclosure 31 may be constructed on a frame 49, as partially shown in FIG. 6, where panels 33, 37a, 37b, 39, 41 and 43 are attached or hung, along their respective edges, to assembled frame members 49, or it may be constructed as a mere assembly of individual panels, as shown in FIG. 1, that meet along their respective intersecting edges and are latched together therealong. Both methods are contemplated in this invention and result in the creation of enclosure interior 45.

Enclosure 31 is denoted as "sealed" in that there are no slots or other apertures in top panel 33, side panels 37a and 37b, front panel 39, rear panel 41 or in bottom panel 43 through which air may freely pass into or out of enclosure 31. In order to insure that enclosure 31 is sealed against unwanted air leakage, either into or out of interior 45, the aforesaid panels may be equipped with seals or gaskets (not shown). Sealed enclosure 31 may be designed in various sizes to contain image projector container 3 in its interior 45 as is hereinafter more fully explained.

Sealed enclosure 31 is designed to have an interior 45 large enough to receive image projector container 3 therein. As shown in FIG. 1, it is preferred that container 3 be mounted on the interior surface of bottom panel 43 and arranged in enclosure interior 45 to have a definite space between container walls 5 and enclosure top panel 33, side panels 37a and 37b, and rear panel 41. Container 3 will be mounted to one interior panel (preferably bottom panel 43) so that there will be no space between the two. Also, image projector 3 contains image projection opening or lens 13 and it is preferred that it be mounted in sealed enclosure 31 with adjustment means so that its lens 13 can be located adjacent a mating lens or clear portion 51 in front panel 39. Instead of a separate clear portion 51, the entire front panel 39 may be made from a clear or transparent engineered plastic such as polycarbonate. A typical sample of such a transparent plastic panel may be made from Lexan® a product of E.I. DuPont de Nemours Co., and readily available in stores throughout the United States of America.

Figure 4:
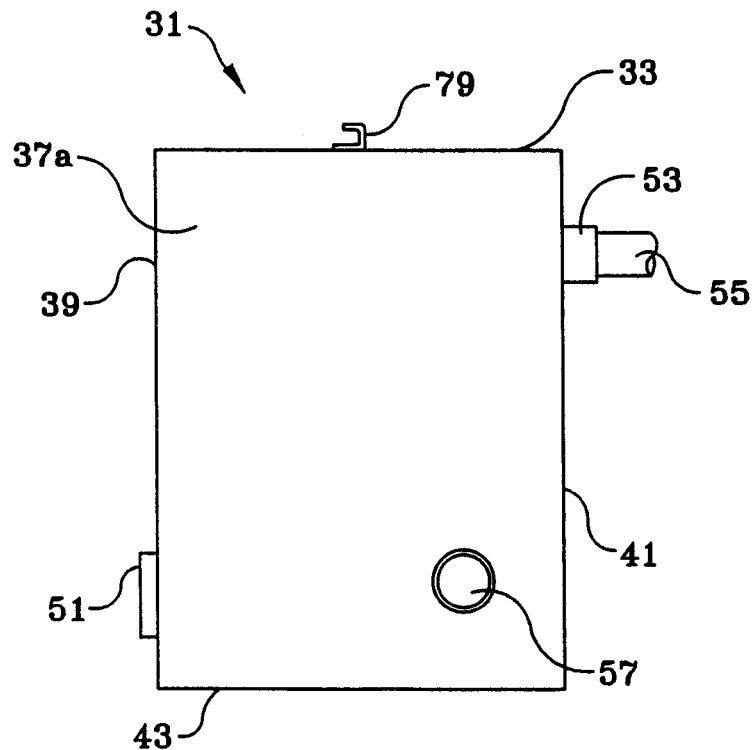
FIG. 4 is an end view of the sealed enclosure shown in FIG. 1.
Figure 5:
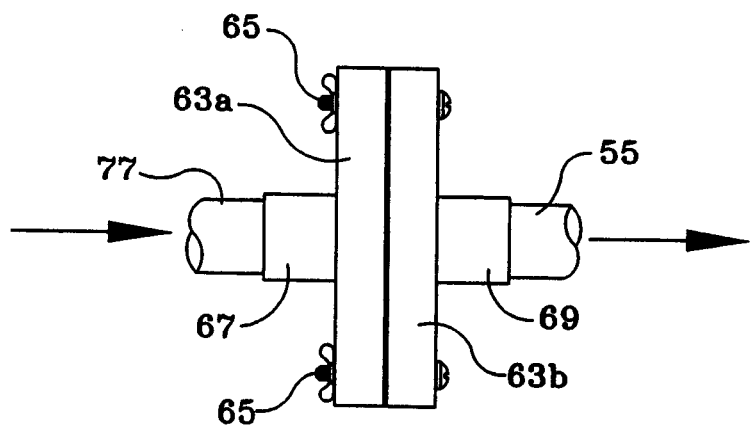
FIG. 5 is a side view of the air filter of this invention.

As shown in FIGS. 4 and 5, an air receiving port 53 is formed in one panel of sealed enclosure 3. A large-diameter, air-conveying duct, hose, or flexible tube 55 is sealingly connected to the outside of port 53, for the purpose of conveying air into sealed enclosure 3. An exhaust port 57 is formed in another panel of sealed enclosure 3. A special tube 61 is provided to connect exhaust opening 19, of container 3, to exhaust port 57. This is specifically done to restrict the air path through sealed enclosure 31 to a path through sealed enclosure 3, then through container 3, then out through tube 61 and through opening 57. As shown in FIG. 5, a pair of filter frames 63a and 63b is provided and arranged to be assembled together and held in assembled form by a plurality of assembly bolts and nuts 65. Interior of filter frame members 63a and 63b are one or more layers (not shown) of filter material spread across the interior of assembled frames 63a and 63b to provide a fully filtered path between an entry port 67, formed in frame member 63a, to an exhaust port 69, formed in frame member 63b. Air drawn or pulled into entry opening 67 will be fully filtered before it leaves through exhaust port 69. Filters such as HEPA filters and the like can provide a high degree of filtration of smoke and dust particles.

Figure 7:
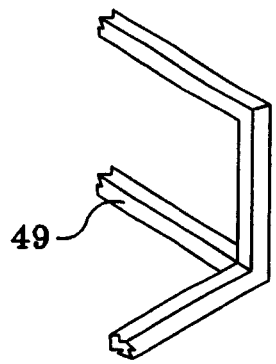

As shown in FIG. 7, a powerful air-moving means, such as an electric air-moving fan 73, is provided in a frame 75 for location either inside, close to, but preferably remote from, sealed enclosure 31 and connected by a similar flexible tube 55 for connection to filter frame inlet 67 (tube 55 shown partially disconnected from frame 75 for clarity). Flexible tube 55 is connected between sealed enclosure air receiving port 53 and filter frame exhaust port 69.

In operation, air moving fan 73 is either located inside sealed container 31 and its feed hose or line 55 has an entrance located at a source of clean, preferably cool air or fan 73 is located at a source of clean, preferably cool, air and is energized to provide a forceable blast of air through flexible tube 55 into filter frame entry opening 67. The air is filtered as it passes through the filters located in the interior of assembled filter frames 63a and 63b and passes through flexible tube 55 into interior 45 of sealed enclosure 31. There, it swirls about the outside of container 3, to cool container walls 5, and then passes into container 3, through slots 15, formed in the walls of container 3, and about the various components of heat-generating broadcast device 9 to cool the interior surfaces of container walls and the various components of device 9. Container inside fan 17 draws the heated air into container exhaust opening 19 and blows it through tube 61 and out sealed enclosure exhaust port 57 to the outside of sealed enclosure 31. The path of the clean, preferably cool, air is controlled to flow into sealed enclosure 3 1, about the outside of container 3, into enclosed interior 7 of container 3, about the heat-generating components of broadcast device 9, through container exhaust fan 17 and out of enclosure 31. In doing so, all the air is forced through and about the heat-generating components of broadcast device 9, to provide maximum cooling, thus leaving no chance that dust, dirt or smoke will be placed in contact with broadcast device 9. Accordingly, not only cooling has taken place, but the cooling is coupled with clean air.

As an example, the specifications of container fan 17 is that it passes 20 CFM (cubic feet per minute) of air out exhaust opening 19. Setting air moving fan 73 to pass 32 CFM of air through filter frames 63a and 63b and into sealed enclosure 31, means that an unbalanced system is created, i.e., more air is coming into sealed enclosure 31 than is ejected by container fan 17. This results in the development of a positive air pressure (pressure above normal) in both sealed enclosure 31 and in container 3. Container fan 17 is made to speed up, by this over-pressure, and then acts as a valve in the system, allowing more air to pass through exhaust opening 19 and out of sealed enclosure 31 than its designed level of 20 CFM. The result of this system is a constant, slight over-pressure of clean air inside container interior 7 and sealed enclosure interior 45 that insures that no smoke nor dust laden air will find its way into either sealed enclosure 31 or container interior 7. Thus is created a continual clean air managing system for cooling broadcast device 9 and insuring that it remains smoke and dust free.

Air moving fan 73 and filter frames 63a and 63b can be located anywhere as long as flexible tubes 55 are long enough to connect fan 73 through filter frames 63a and 63b to sealed enclosure air receiving port 53. For instance, if the location of broadcast device 9 is in a bar located in a temperate climate, fan 73 and filter frames 63a/63b can be located in another room in the bar (that is not smoke-laden) or located outside the building containing broadcast device 9. If, however, the location of broadcast device 9 is in a bar located in a hot or dusty climate, fan 73 and filter frames 63a/63b can be located in another room in the bar that is not smoke-laden. They also can be located in an air-conditioned room that is cooler than the temperature in the bar or at the ceiling in the bar if sealed enclosure 31 is to be ceiling mounted.

A pair of hangers 79 is provided in top panel 33 of sealed enclosure 31 for hanging enclosure 31 to the ceiling or to a bracket (not shown) that is itself mounted to the ceiling. As shown in FIG. 1, various panels of sealed enclosure 31, such as side panel 37b, and rear panel 41, may be hinged for rotation (as shown by dotted lines) out from sealed enclosure 31 to provide access to enclosure interior 45 for the purpose of replacing the broadcast device components, cleaning lens 13 or enclosure front panel 39 or 51.

While the invention has been described with reference to a particular embodiment thereof, those skilled in the art will be able to make various modifications to the described embodiment of the invention without departing from the true spirit and scope thereof. It is intended that all combinations of elements and steps which perform substantially the same function in substantially the same way to achieve substantially the same result are within the scope of this invention.

What is claimed is:

1. An air-managing system for a heat-generating, image-producing broadcast device mounted in a smoke laden or dust-laden environment, comprising:

a) a container including enclosed walls and an image broadcast aperture, to form an interior for containing the heat-generating, image-producing, broadcast device and further including inlet slots formed in said container walls, for receiving air into said container interior, a container exhaust opening, and a fan in communication with said exhaust opening for drawing air through said interior and pushing it out said container;

b) a sealed enclosure comprising a top panel, bottom panel, opposed side panels and spaced-apart front and back panels in sealed engagement forming an interior therein large enough to house said container therein leaving space between said container walls and said enclosure panels;

c) means in said sealed enclosure to align said image broadcast aperture with an image projection opening in one of said sealed enclosure panels;

d) air-transfer means in communication with said sealed enclosure for pumping air, outside of said enclosure, into said sealed enclosure and developing a positive air pressure therein; and, e) an air exhaust port formed in said sealed enclosure and connected to said fan in communication with said exhaust opening of said container to confine the flow of pressurized air in said enclosure means to a path passing through said broadcast device and said container.

2. The air-managing system of claim 1 wherein said air-transfer means includes an air-blower, said air-receiving port being adapted to communicate with said air-blower.

3. The air-managing system of claim 1 wherein said air-transfer means is connected to an air source remote from said enclosure means by an air-transport means for drawing the air therethrough and pumping it inside said enclosure means for developing and maintaining the positive air pressure.

4. The air-managing system of claim 3 wherein said air-transport means includes a flexible duct.

5. The air-managing system of claim 1 wherein said means for connecting said enclosure air exhaust port to said broadcast device air outlet port includes a tube provided therebetween for permitting the passing of the pressurized air to the outside of said enclosure.

6. The air-managing system of claim 1 wherein said enclosure includes a filter in the path of the air being pumped into said enclosure.

7. The air-managing system of claim 1 wherein said enclosure has at least one wall, said at least one wall being openable for allowing access to the interior of said broadcast device.

8. The air-managing system of claim 1 wherein said enclosure has at least one wall, said at least one wall having formed therein a communications-aperture for allowing the broadcasting of transmitted information produced from said broadcast device, to be transmitted to the outside of said enclosure.

9. An air-managing system for providing supplemental cooling to an air-cooled multi-media image projector including a container of the type having an air-inlet opening, an air-moving means, and an air outlet opening, comprising:

a) enclosure means for surrounding the image projector, said means defined by an air-receiving port, an air-exhaust port, and a front wall, said front wall is adapted to permit the transmitting of an image therethrough from the image projector;

b) air-transfer means in communication with said enclosure means for drawing outside air into said enclosure means and developing a positive air pressure therein; and, c) means for connecting said enclosure air exhaust port to said image projector air outlet opening to confine the flow of pressurized air in said enclosure means to a path passing through said image projector.

10. The air-managing system of claim 9 wherein said front wall has formed therein an aperture for permitting a projector image to be transmitted therethrough.

11. The air-managing system of claim 9 wherein said front wall is diaphanous for permitting the projector image to be transmitted therethrough.

12. The air-managing system of claim 9 wherein said air-transfer means includes a fan, said air-receiving port being adapted to communicate with said fan.

13. The air-managing system of claim 9 wherein said fan is connected to an air source remote from said enclosure means by an air-transporting duct for drawing the air therethrough and pumping it inside said enclosure means for developing and maintaining the positive air pressure.

14. The air-managing system of claim 9 wherein said means for connecting said enclosure air exhaust port to said image projector air outlet port includes a tube, said tube limiting the passing of the pressurized air to the outside of said enclosure.

15. The air-managing system of claim 9 wherein said enclosure includes a filter in the path of the air being pumped into said enclosure.

16. The air-managing system of claim 9 wherein said enclosure means has a wall that is openable for gaining access to the interior of said enclosure.

17. The air-managing system of claim 9 wherein said front wall is openable for allowing access to the broadcast device.

18. The air-managing system of claim 9 including a bottom wall in said enclosure and wherein said bottom wall is openable for allowing access to the broadcast device contained therein.

19. The air-managing system of claim 9 wherein said front wall is removable for allowing access to the broadcast device.

20. The air-managing system of claim 9 wherein said air-receiving port is provided in said rear wall.

21. The air-managing system of claim 9 wherein the image projector includes a suspension means for permitting the broadcast device to be hung in a high position to limit interference from people.

22. The air-managing system of claim 9 wherein said fan is a propeller fan.

* * * * *